United States Patent [19]

Kobayashi

[11] Patent Number: 4,475,081
[45] Date of Patent: Oct. 2, 1984

[54] ELECTRONIC WATTHOUR METER

[75] Inventor: Shunichi Kobayashi, Tokyo, Japan

[73] Assignee: Tokyo Shibaura Denki Kabushiki Kaisha, Kawasaki, Japan

[21] Appl. No.: 333,887

[22] Filed: Dec. 23, 1981

[30] Foreign Application Priority Data

Mar. 6, 1981 [JP] Japan ................... 56-31282

[51] Int. Cl.³ ............................................. G01R 11/32
[52] U.S. Cl. .................................... 324/142; 324/107
[58] Field of Search ..................... 324/107, 134, 142

[56] References Cited

U.S. PATENT DOCUMENTS

| 2,900,605 | 8/1959 | Squires et al. | 324/142 |
| 3,731,190 | 5/1973 | Schwendtner | |
| 4,058,768 | 11/1977 | Milkovic | 324/142 |
| 4,315,212 | 2/1982 | Gamoh | 324/142 |

FOREIGN PATENT DOCUMENTS 5149430 6/1972 Japan .

Primary Examiner—Stewart J. Levy
Attorney, Agent, or Firm—Finnegan, Henderson, Farabow, Garrett & Dunner

[57] ABSTRACT

An electronic watthour meter includes a power flow direction detector circuit which detects the power flow direction and a pulse width modulation circuit for converting a voltage signal proportional to the load voltage into a pulse signal. In accordance with the output of the power flow direction circuit, the polarity of the output signal of the pulse width modulation circuit is either inverted or not inverted. A multiplication circuit produces the product of the voltage signal proportional to the load voltage and a voltage signal proportional to the load current under the control of the output of the pulse modulation circuit.

2 Claims, 2 Drawing Figures

ELECTRONIC WATTHOUR METER

BACKGROUND OF THE INVENTION

1. Field of the Invention

This invention relates to electronic watthour meters, and more particularly to an electronic watthour meter in which the consumption of power is indicated in accordance with the direction of power flow.

An electric power supply company monitors conditions of power demand and supply which change momentarily. The company balances power demand with power supply, that is, the delivered power with the generated power. To maintain the balance between power demands and supplies, different power companies exchange power to satisfy varying load conditions. Thus a company that has excess power at a given time will deliver power to a company that is short of power at that time. In this case, the direction of power flow indicates the momentary conditions of power demand and supply between companies. The companies always monitor these conditions to operate power exchanges within the overall electric power system. The quantity of the delivered and returned power is measured by the watthour meter described hereinafter.

2. Description of the Prior Art

In a first prior art meter, two induction types of watthour meters are used. Both tend to take up a large amount of space. One of the two watthour meters has a disk which rotates only in one direction to measure the delivered power. The other watthour meter has a disk which rotates only in the opposite direction to measure the returned power.

In a second prior art watthour meter apparatus, one induction type of watthour meter is used. A detecting circuit detects the direction of the power flow. The detecting circuit changes the polarity of a load voltage or a load current in the detecting circuit of the watthour meter according to the direction of the power flow. For example, the polarity of a potential transformer in the load voltage detecting circuit or in a current transformer in the load current detecting circuit is changed by the power flow detecting circuit according to the power flow direction. Accordingly, the watthour meter has a disk which rotates only in one direction, although the power flow varies. However, errors arise when the polarity of the potential or current transformer is changed and this causes inaccurate power measurements, because the output signal of the potential transformer or the current transformer causes the error.

In a third prior art meter, an electric watthour meter uses a time sharing multiplication circuit. The output voltage of this circuit is integrated, and the integrated voltage is applied to a voltage-to-frequency converter. The output signal of that converter indicates the consumed power. A power flow direction detector detects the output voltage of an integrator in the voltage-to-frequency converter. In this case, the power is delivered if the output voltage of the integrator is positive. If it is negative, the power is returned from the other company. When the power is returned, the polarity of the input signal of the integrator is changed and a quantity of the positive power is indicated by a power indicator. When the power is delivered, a quantity of the power is indicated as it is.

In this prior art electric watthour meter, the power flow is detected by the output signal of the integrator. An offset voltage of an operational amplifier in the integrator has an adverse effect on the accuracy of the indicator of the power flow direction.

SUMMARY OF THE INVENTION

It is an object of this invention to provide an electronic watthour meter which indicates the consumed power according to the power flow direction.

According to this invention, an electronic watthour meter comprises first means for deriving a voltage signal proportional to the load voltage on the power supply lines, second means for deriving a voltage signal proportional to the load current on the power supply lines, a pulse width modulation circuit for subjecting the voltage signal from the first means to pulse width modulation to obtain a pulse width duty cycle signal, a circuit for detecting the power flow direction by comparing the voltage signal from the first means with the voltage signal from the second means, a circuit for inverting the polarity of the pulse width duty cycle signal according to the output of the detecting circuit, a multiplication circuit for producing a pulse signal of the product of the voltage signal from the first means and the voltage signal from the second means by a switching operation under the control of the output signal from the inverting circuit, an integration circuit for integrating the pulse signal from the multiplication circuit to a DC voltage, a voltage-to-frequency converter for converting the DC voltage from the integration circuit to a pulse signal which has a frequency proportional to the DC voltage, and means for indicating the output of the voltage-to-frequency converter in accordance with the power flow direction detected by the detecting circuit.

DESCRIPTION OF THE PREFERRED EMBODIMENTS

Figure 1:
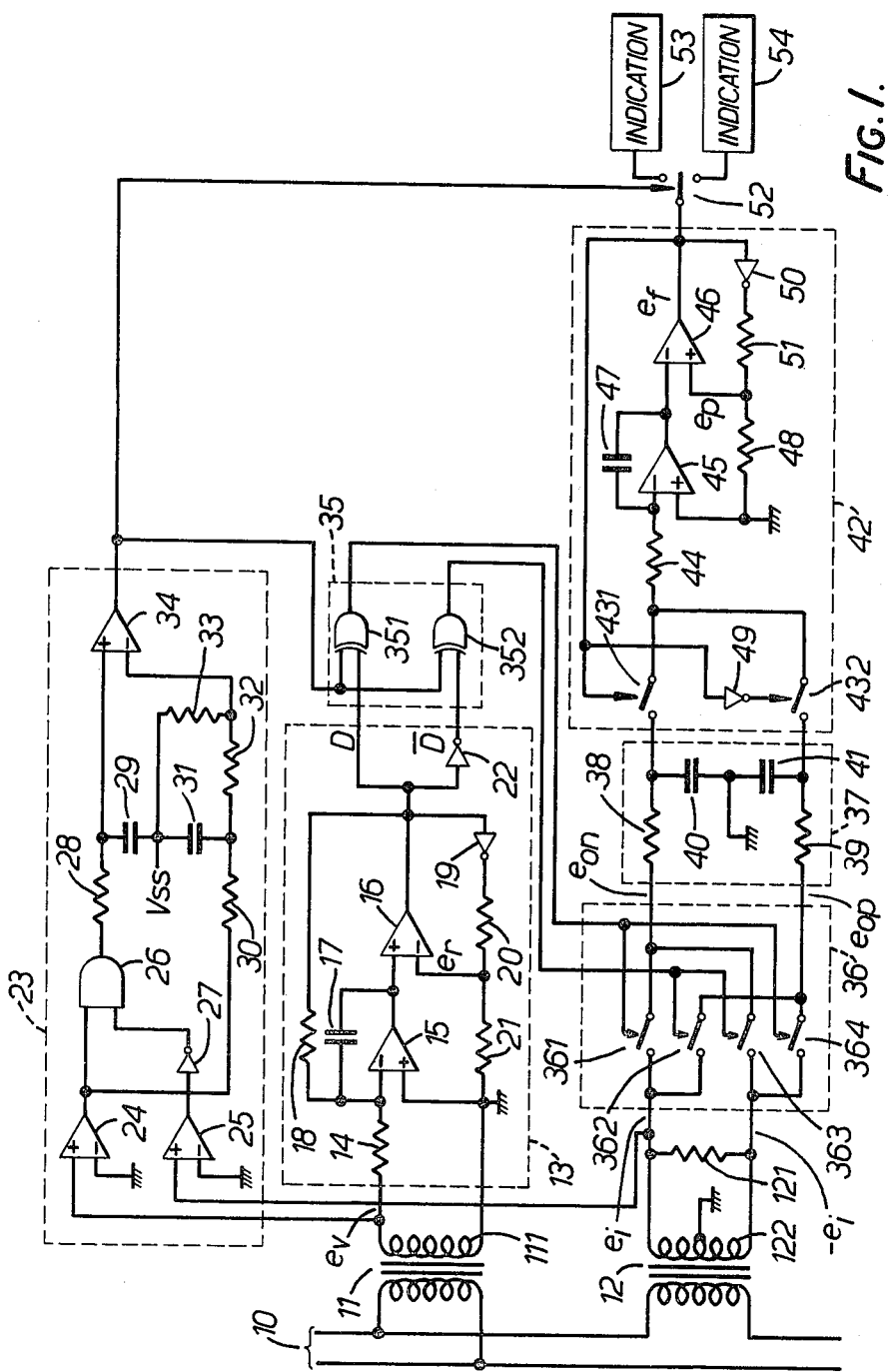
FIG. 1 is a circuit diagram showing an embodiment according to this invention.

FIG. 1 is a circuit diagram according to this invention. A potential transformer 11 connected to power supply lines 10 produces an output voltage ev proportional to a load voltage. A current transformer 12 connected to the power supply lines 10 produces an output current i proportional to a load current. Voltages ±ei are developed across resistor 121, and the voltage ei is proportional to the load current i. The center tap of secondary winding 122 of the current transformer 12 is grounded, as shown.

A pulse width modulation circuit 13 is described hereinafter. The voltage signal ev is applied to the negative input of an integrator circuit 15, composed of an operational amplifier, through a resistor 14. The output of the integrator circuit 15 is applied to the positive input of a comparator circuit 16 composed of an operational amplifier. A capacitor 17 is interposed between the negative input and the output of the integrator circuit 15 for input signal integration. The output of the comparator circuit 16 is applied to the negative input of the integrator circuit 15 through a resistor 18 and is also applied to an inverter circuit 19. The output of the inverter circuit 19 is subjected to voltage division by resistors 20 and 21, and the resultant signal is applied to the negative input of the comparator circuit 16. The resistance of the resistor 20 is equal to that of the resistor 21.

One terminal of the resistor 20 is connected to the negative input of the comparator 16 and the other terminal is connected to the output of the inverter circuit 19. One terminal of the resistor 21 is grounded and the other terminal is connected to the above-noted terminal of the resistor 20. The output of the comparator 16 has a pulse width duty cycle signal D. The output of the comparator circuit 16 is applied to the input of the inverter circuit 22. The output of the inverter circuit 22 has a pulse width duty cycle signal $\overline{D}$.

A power flow direction detector circuit (which is referred to hereinafter as "detector circuit") 23 is described hereinafter. The positive input of a comparator circuit 24 composed of an operational amplifier is connected to one terminal of the secondary winding 111 of the potential transformer 11. The negative input of the comparator circuit 24 is grounded. The output signal ev of the potential transformer 11 is converted to a pulse signal according to the phase of ev by the comparator circuit 24.

The positive input of a comparator circuit 25 composed of an operational amplifier is connected to one terminal of the secondary winding 122 of the current transformer 12. The negative input of the comparator circuit 25 is grounded. The signal ei is converted to a pulse signal according to the phase of ei by the comparator circuit 25.

The output of the comparator circuit 24 is applied to one terminal of an AND circuit 26. The output of the comparator circuit 25 is applied to the other terminal of the AND circuit 26 through an inverter circuit 27. The output of the AND circuit 26 is a pulse signal of which the pulse width is the phase difference between the voltage signal ev and the inverted voltage signal ei.

One terminal of a resistor 28 is connected to the output of the AND circuit 26, and the other terminal is connected to one terminal of a capacitor 29. The other terminal of the capacitor 29 is connected to a minus voltage source Vss. The integrator circuit composed of the resistor 28 and the capacitor 29 integrates the output signal of the AND circuit 26.

One terminal of a resistor 30 is connected to the output of the comparator circuit 24, and the other terminal is connected to one terminal of a capacitor 31. The other terminal of the capacitor 31 is connected to the minus voltage source Vss. The integrator circuit composed of the resistor 30 and the capacitor 31 integrates the output signal of the comparator 24, that is, the pulse width corresponding to a half cycle (180°) of the load voltage. One terminal of the resistor 32 is connected to one terminal of the resistor 30, and the other terminal of the resistor 32 is connected to one terminal of a resistor 33. The other terminal of the resistor 33 is connected to the minus voltage source Vss. The resistance of the resistor 32 is equal to that of the resistor 33. In this case, the voltage division circuit composed of the resistors 32 and 33 divides the output voltage of the integrator circuit composed of the resistor 30 and the capacitor 31 in half. That is, the output voltage corresponds to the pulse width of a quarter-cycle (90°) of the load voltage.

The positive input of a comparator circuit 34 composed of an operational amplifier is connected to one terminal of the resistor 28, and the negative input is connected to one terminal of the resistor 32. The comparator circuit 34 compares the output voltage of the voltage division circuit composed of the resistors 32 and 33 with the output voltage of the integrator circuit composed of the resistor 28 and the capacitor 29 and produces pulse signals if the output voltage of the integrator circuit is greater than that of the voltage division circuit. In this detector circuit 23, the comparator circuit 34 produces a signal if the integrated output signal of the AND circuit 26 is greater than the integrated pulse width signal corresponding to 90°.

The comparator circuits 24 and 25 convert the voltage signals ev and ei to the pulse signals according to the phase of ev and ei. The AND circuit 26 compares the output signal of the comparator circuit 24 with the output signal of the comparator circuit 25 and produces the pulse signal. The integrator circuit composed of the resistor 28 and the capacitor 29 integrates the output signal of the AND circuit 26. The integrator circuit composed of the resistor 30 and the capacitor 31 integrates the output signal of the comparator 24. This integrator circuit integrates the pulse width signal corresponding to 180°.

The voltage division circuit composed of the resistors 32 and 33 divides the integrated output signal into a half of the integrated output signal. The comparator 34 compares the output voltage of the integrator circuit composed of the capacitor 28 and the resistor 29 with the divided voltage. The comparator circuit 34 produces a pulse signal if the integrated voltage is greater than the integrated pulse width signal corresponding to 90°. When the comparator circuit 34 produces a logic signal "1", the power flow direction is detected as "the returned power". The logic signal "0" indicates "the delivered power".

An inversion circuit 35 includes exclusive OR circuits 351 and 352. One input of each of the exclusive OR circuits 351 and 352 is connected to the output of the comparator circuit 34. The other input of the exclusive OR circuit 351 is connected to the output of the comparator circuit 16, and the other input of the exclusive OR circuit 352 is connected to the output of the inverter circuit 22. The pulse width duty cycle signal D passes through the exclusive OR circuit 351 if the output signal of the comparator circuit 34 is "0". If the output signal of the comparator circuit 34 is "1", the output signal of the exclusive OR circuit 351 is the inverted pulse width duty cycle signal $\overline{D}$. The pulse width duty cycle signal $\overline{D}$ of the inverter circuit 22 is also inverted and the exclusive OR circuit 352 produces the signal D.

The voltage signals ±ei are applied to a multiplication circuit 36. The multiplication circuit 36 includes analog switches which are turned on with a logic signal "1" and turned off with a logic signal "0". The analog switches are made up of semiconductor devices such as J-FETs and MOS-FETs. The inputs of the analog switches 361 and 362 are connected to one terminal of the secondary winding 122 of the current transformer 12 while the inputs of the analog switches 363 and 364 are connected to the other terminal. The output signal of the exclusive OR circuit 351 drives the analog switches 361 and 364 and the output signal of the exclusive OR circuit 352 drives the analog switches 362 and 363.

The output signal of the analog switches 361 and 363 is an instantaneous voltage signal eon and the voltage signal eon is applied to an integration circuit 37. The output signal of the analog switches 362 and 364 is an instantaneous voltage signal eop and the voltage signal eop is applied to an integration circuit 37.

The integration circuit 37 includes resistors 38, 39 and capacitors 40, 41. One terminal of the resistor 38 is connected to the outputs of the analog switches 361 and 363, and the other terminal is connected to one terminal of the capacitor 40. One terminal of the resistor 39 is connected to the outputs of the analog switches 362 and 364, and the other is connected to one terminal of the capacitor 41. The other terminals of the capacitors 40 and 41 are connected to each other and grounded.

The output signals of the integration circuit 37 are voltage signals $\overline{eop}$ and $\overline{eon}$ which are equal in absolute value and opposite in polarity. The voltage signal $\overline{eop}$ or $\overline{eon}$ is a DC voltage proportional to the instantaneous consumption power, that is, the product of the voltage signal ev, proportional to the load voltage of the power supply lines 10, and the voltage signal ei, proportional to the load current of the power supply lines.

The DC voltage signals $\overline{eop}$ and $\overline{eon}$ are applied to a voltage-to-frequency converter 42. The inputs of analog switches 431 and 432 are connected to the output of the integrator circuit 37. The outputs of the analog switches 431 and 432 are connected to each other and are also connected to the negative input of an integrator circuit 45 composed of an operational amplifier through a resistor 44. The positive input of the integrator circuit 45 is grounded.

The output of the integrator circuit 45 is connected to the positive input of a comparator circuit 46 composed of an operational amplifier. The comparator circuit 46 produces a logic signal "1" or "0" whenever the integrator output of the circuit 45 reaches a predetermined value. The output of the integrator circuit 45 is fed back to the negative input thereof through a capacitor 47. The negative input of the comparator circuit 46 is grounded through a resistor 48.

Analog switches 431 and 432 are operated by the output of the comparator circuit 46. The output of the comparator circuit 46 is applied to the analog switch 432 through an inverter circuit 49, so that the switch 432 is opened when the switch 431 is closed and vice versa. Furthermore, the output of the comparator circuit 46 is connected to the negative input thereof through an inverter circuit 50 and a resistor 51.

The output of the voltage-to-frequency converter 42 is indicated in indication devices 53 or 54 by the operation of switch 52 which is operated by the output of the detector circuit 23. When the power is delivered, the switch 52 is connected to this indication device 53 and the delivered power is indicated in the device 53. On the other hand, the switch 52 is connected to the indication device 54 and the returned power is indicated in the device 54 when the power is returned.

The operation of the circuit shown in FIG. 1 will now be described.

The voltage signal ev of the potential transformer 11 is converted to the pulse width duty cycle signal by the pulse width modulation circuit 13. The duty time of the logic signal "1" or "0" of the pulse width duty cycle signal D or $\overline{D}$ is proportional to the magnitude of the voltage signal ev. The pulse width duty cycle signals D and $\overline{D}$ can be expressed as follows:

$$D = (er - ev)/2er = ta/T \quad (1)$$

$$\overline{D} = (er + ev)/2er = tb/T \quad (2)$$

Where er is the reference voltage which is applied to the negative input of the comparator circuit 16 in the pulse width modulation circuit 13, the time width ta is the logic signal "1" of the pulse width duty cycle signal D, the time width tb is the interval of the logic signal "0" of the signal D and the time T is the cycle of the signal D.

The detector circuit 23 including two comparators 24 and 25 converts the voltage signals ev and ei to the pulse signals, detects the phase difference between the signals ev and ei, and converts the pulse signals to pulse width signals corresponding to the phase difference. The DC voltage of the integrated pulse signals is compared with the reference voltage. When the power is "delivered" or "returned", the detector circuit 23 produces the logic signals "0" and "1", respectively.

The output signals D and $\overline{D}$ are applied to the multiplication circuit 36 through the inversion circuit 35 according to the detector circuit 23 when the power is delivered. When the power is returned, the inversion circuit 35 inverts the polarity of the output signal of the pulse width modulation circuit 13. That is, since the detector circuit 23 produces the logic signal "0", the polarity of the output signal of the pulse width modulation circuit 13 is not inverted when the power is delivered. When the power is returned, the detector circuit 23 produces the logic signal "1" and the polarity of that is inverted. The voltage signals ±ei of the current transformer 12 are applied to the multiplication circuit 36.

The pulse width duty cycle signal of the pulse width modulation circuit 13 drives a plurality of analog switches of the multiplication circuit 36. Consequently, an output signal of the multiplication circuit 36 has a pulse width proportional to the magnitude of the voltage signal ev and an amplitude proportional to the magnitude of the voltage signal ei.

In the case of the delivered power, the pulse width duty cycle signal D is used to turn on the analog switches 361 and 364 of the multiplication circuit 36 when the signal D is the logic signal "1", and the signal $\overline{D}$ is used to turn on the analog switches 362 and 363 when the signal $\overline{D}$ is the logic signal "1". Then, the voltage signals ±ei, proportional to the load current of the power supply lines 10, are applied to the multiplication circuit 36 to obtain the DC voltage signals eop and eon by the analog switches 361 to 364. That is, the DC voltage signals eop and eon, provided by the multiplication of the voltage signals ev and ei, are obtained by controlling the on-off operations of the analog switches 361 to 364 with the pulse width duty cycle signals D and $\overline{D}$ of the pulse width modulation circuit 13. These voltage signals eop and eon can be expressed as follows:

$$eop = ei \cdot \overline{D} + (-ei) \cdot D \quad (3)$$

$$= ei \cdot \frac{er + ev}{2er} + \left(-ei \cdot \frac{er - ev}{2er}\right)$$

$$= \frac{ei \cdot ev}{er}$$

$$eon = ei \cdot D + (-ei) \cdot \overline{D} \quad (4)$$

$$= ei \cdot \frac{er - ev}{2er} + \left(-ei \cdot \frac{er + ev}{2er}\right)$$

$$= \frac{-ei \cdot ev}{er}$$

The integration circuit 37 integrates the output signals eop and eon of the multiplication circuit 36 and the DC voltage signals $\overline{eop}$ and $\overline{eon}$ are obtained.

$$\overline{eop} = \frac{\overline{(ei \cdot ev)}}{er} \tag{5}$$

$$\overline{eon} = \frac{\overline{(-ei \cdot \rho ev)}}{er} \tag{6}$$

As is obvious from the equations (5) and (6), the signals $\overline{eop}$ and $\overline{eon}$ are equal in absolute value, and are positive and negative DC voltage signals proportional to the instantaneous power represented by ei and ev.

The voltage-to-frequency converter 42 produces the pulse signal whose frequency is proportional to the DC output voltage of the integration circuit 37. The comparator circuit 46 produces the logic signal "1" or "0" according to the integration output voltage value. When the comparator circuit 46 produces the logic signal "1", the analog switch 431 is closed to apply the DC voltage signal $\overline{eon}$ to the integrator circuit 45. When the comparator circuit 46 produces the logic signal "0", the analog switch 432 is closed to apply the DC voltage signal $\overline{eop}$ to the integrator circuit 45. Thus, the integration output of the integrator circuit 45 is proportional to the DC voltage signal $\overline{eop}$ or $\overline{eon}$ (instantaneous power), and the logic signal of the comparator circuit 46 is inverted by the predetermined voltage value of the integration output to form a pulse frequency. Accordingly, a frequency signal f, proportional to the power, can be obtained at the output of the comparator circuit 46.

The period time To of the output signal ef of the comparator circuit 46 can be expressed as follows:

$$To = tc + td \tag{7}$$

where tc is on time of the analog switch 432, and td is on time of the analog switch 431. Accordingly, the frequency of the signal ef can be expressed as follows:

$$f = 1/To = 1/(tc + td) \tag{8}$$

The time tc and td can be expressed as follows:

$$t_c = \frac{ep \cdot R_1 \cdot C_1}{\overline{eop}} \tag{9}$$

$$t_d = \frac{ep \cdot R_1 \cdot C_1}{-\overline{eon}} \tag{10}$$

where ep is the reference voltage which is applied to the negative input of the comparator circuit 46, $R_1$ is the resistance of the resistor 44, and $C_1$ is the capacitance of the capacitor 47.

If the equations (5) and (6) are substituted into the equations (9) and (10), then $$t_c = \frac{ep \cdot R_1 \cdot C_1}{\frac{\overline{ei \cdot ev}}{er}} \tag{11}$$

$$t_d = \frac{ep \cdot R_1 \cdot C_1}{\frac{\overline{ei \cdot ev}}{er}} \tag{12}$$

Accordingly, the frequency f can be expressed as follows:

$$f = \frac{\overline{ei \cdot ev}}{2er \cdot ep \cdot R_1 \cdot C_1} \tag{13}$$

As obvious from the equation (13), f is proportional to the product $\overline{ei \cdot ev}$, that is, the consumption power, since er, ep, $R_1$ and $C_1$ are all constant. The power is indicated in the indication device 53 when the switch 52 is connected to the indication device 53 according to the output signal of the detector circuit 23.

In the case of the returned power, the inversion circuit 35 inverses the polarity of the output signal of the pulse width modulation circuit 13 and the voltage signals eop and eon can be expressed as follows:

$$eop = ei \cdot D + (-ei)\overline{D} = -\frac{ei \cdot ev}{er} \tag{3)'}$$

$$eon = \rho ei \cdot \overline{D} + (-ei) \cdot D = \frac{ei \, ev}{er} \tag{4)'}$$

In this case, the frequency f can be expressed as follows:

$$f = -\frac{\overline{ei \cdot ev}}{2er \cdot ep \cdot R_1 \cdot C_1} \tag{13)'}$$

That is, the output frequency f proportional to the returned power is obtained. The power is indicated in the indication device 54 when the switch 52 is connected to the indication device 54 according to the output signal of the detector circuit 23.

The first embodiment has been described with reference to the single-phase two-line watthour meter. However, with a plurality of potential transformers, a plurality of current transformers and a plurality of multiplication circuits, this invention can be applied to a polyphase watthour meter. In this polyphase watthour meter, the electrical energy is the sum of the powers of the phases. The voltage signals proportional to the load voltages of the power lines are ei1, ei2, ..., ein. The proportional constants are K1, K2, ..., Kn. Accordingly, the power Po can be expressed as follows:

$$Po = K1ev1 \cdot ei1 + K2ev2 \cdot ei2 + \ldots + Knevn \cdot ein \tag{14}$$

Similar to the first embodiment of the operation of the multiplication circuit, the output signals of the multiplication circuits are added by the integration circuit 37. As a result, the power Po satisfying the equation 14 can be obtained.

Figure 2:
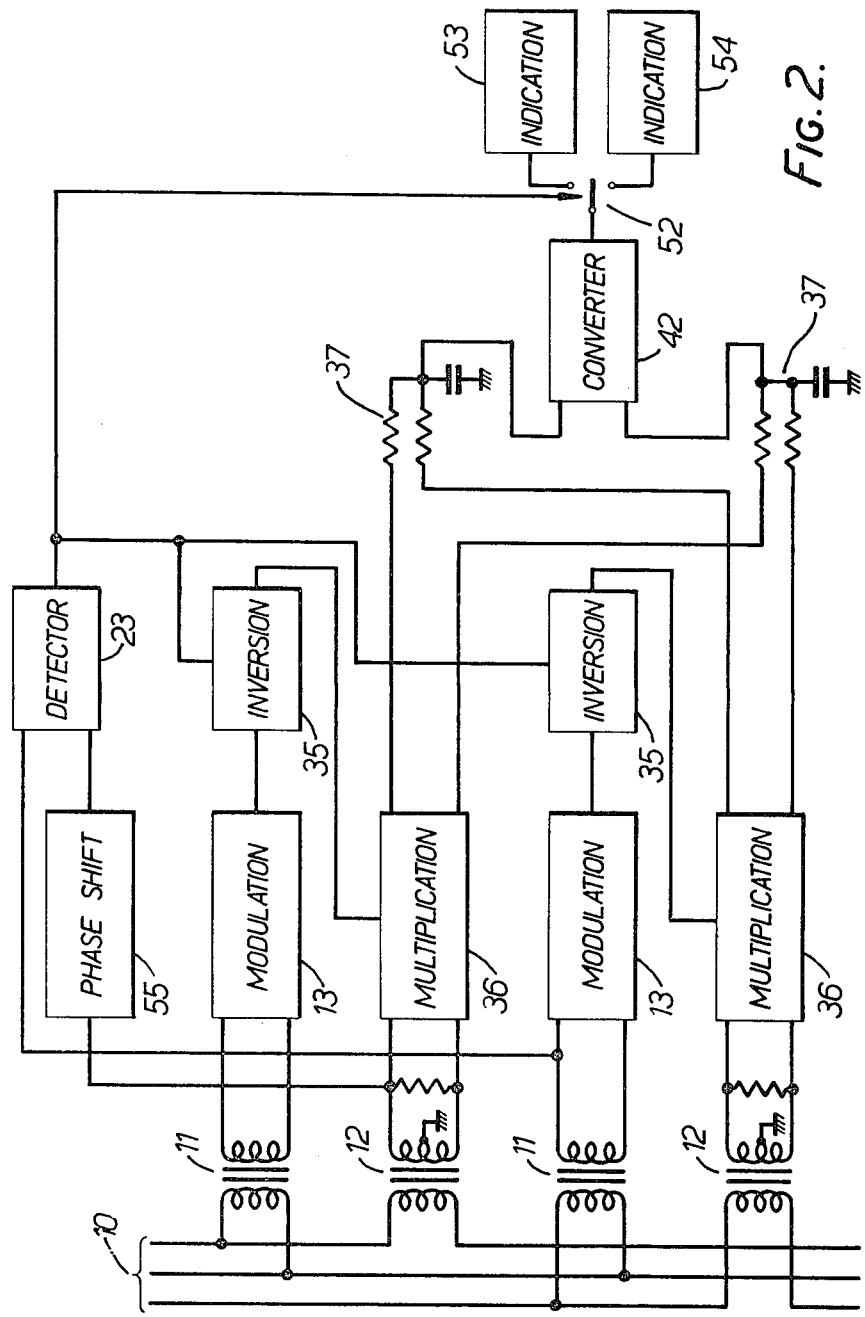
FIG. 2 is a block diagram of this invention applied to a polyphase watthour meter.

FIG. 2 is a circuit diagram of the second embodiment of this invention applied to the polyphase watthour meter. In FIG. 2, those components which have previously been described with reference to FIG. 1 have been similarly numbered, and their operation is also similar to those described before. In this second embodiment, a plurality of potential transformers 11, pulse width modulation circuit 13, current transformers 12, inversion circuits 35 and multiplication circuits 36 are provided. The output signal of each multiplication circuit 36 is applied to the voltage-to-frequency converter 42 through the integration circuit 37.

In this second embodiment, a pair of the potential transformers 11 and a pair of the current transformers 12 detect an interphase voltage and a line current between the phases, respectively. Voltage signals according to the interphase voltage and the line current are applied to the detector circuit 23. A phase-shift circuit 55 is interposed between one terminal of the secondary winding of the current transformer 12 and one of inputs of the detector circuit 23 to adjust the phase difference between the interphase voltage and line current. The voltage signal according to the line current passing through the phase-shift circuit 35 and the voltage signal according to the interphase voltage are applied to the detector circuit 23 and the power flow direction is detected. The phase-shift circuit 55 is a well-known filter circuit composed of, for example, a resistor and a capacitor.

According to this invention, the power flow direction is detected by the phase difference between the load voltage and the load current of the power supply lines and the delivered or returned power is indicated separately by the indicator device. Since the two induction type watthour meters used in prior art devices are not necessary, the meter in accordance with the instant invention consumes less space. Also, since the polarity of the potential or current transformer does not change, errors caused by such changes in prior art devices do not occur.

Furthermore, an in-phase offset voltage of the comparator circuit comprised of an operational amplifier is added to the compared voltage in the instant invention. Since the power flow direction is not detected by the integrator circuit comprised of an operational amplifier, the offset voltage of the operational amplifier does not influence the accuracy of the detection of the power flow direction, and the amount of delivered power or the returned power is thereby accurately determined.

What is claimed is:

1. An electronic watthour meter comprising:
   first means for deriving a voltage signal proportional to the load voltage on power supply lines;
   second means for deriving a voltage signal proportional to the load current on the power supply lines;
   a pulse width modulation circuit for subjecting said voltage signal from said first means to pulse width modulation to obtain a first pulse signal;
   a circuit for detecting the power flow direction by comparing the voltage signal from said first means with the voltage signal from said second means;
   a circuit for inverting the polarity of the first pulse signal according to the output of said detecting circuit;
   a multiplication circuit for producing a second pulse signal representing the product of said voltage signal from said first means and said voltage signal from said second means, under the control of the output signal from said inverting circuit;
   an integration circuit for integrating the second pulse signal from said multiplication circuit to a DC voltage;
   a voltage-to-frequency converter for converting the DC voltage from said integration circuit to a pulse signal which has a frequency proportional to the DC voltage; and
   means for indicating the output of said voltage-to-frequency converter in accordance with the power flow direction detected by said detecting circuit.

2. An electric watthour meter for polyphase power comprising:
   a plurality of first means for deriving voltage signals proportional to the load voltage on power supply lines;
   a plurality of second means for deriving voltage signals proportional to the load current on the power supply lines;
   a plurality of pulse width modulation circuits for subjecting said voltage signals from said first means to pulse width modulation to obtain first pulse signals;
   a phase-shift circuit for shifting the phase of one of the voltage signals from said second means and producing a phase voltage signal;
   a circuit for detecting the power flow direction by comparing one of the voltage signals from said first means with the phase voltage signal from said phase-shift circuit;
   a plurality of circuits for inverting the polarity of the first pulse signals in accordance with the output of said detecting circuit;
   a plurality of multiplication circuits for producing second pulse signals representing the products of said voltage signals from said first means and said voltage signals from said second means, under the control of the output signals from said inverting circuits;
   an integration circuit for integrating the second pulse signals from said multiplication circuits to a DC voltage;
   a voltage-to-frequency converter for converting the DC voltage from said integration circuit to a third pulse signal which has a frequency proportional to the DC voltage; and
   means for indicating the output of said voltage-to-frequency converter in accordance with the power flow direction detected by said detecting circuit.

* * * * *